United States Patent
Hegde et al.

[11] Patent Number: 5,580,823
[45] Date of Patent: Dec. 3, 1996

[54] PROCESS FOR FABRICATING A COLLIMATED METAL LAYER AND CONTACT STRUCTURE IN A SEMICONDUCTOR DEVICE

[75] Inventors: Rama I. Hegde; Robert W. Fiordalice; Dave Kolar, all of Austin, Tex.

[73] Assignee: Motorola, Inc., Schaumburg, Ill.

[21] Appl. No.: 356,756

[22] Filed: Dec. 15, 1994

[51] Int. Cl.$^6$ .................................................. H01L 21/283
[52] U.S. Cl. ........................... 437/192; 437/194; 437/246; 204/192.17
[58] Field of Search ..................................... 437/190, 192, 437/194, 246; 204/192.12, 192.17

[56] References Cited

U.S. PATENT DOCUMENTS

| | | | |
|---|---|---|---|
| 5,171,412 | 12/1992 | Talieh et al. | 204/192.15 |
| 5,356,836 | 10/1994 | Chen et al. | 437/194 |
| 5,403,779 | 4/1995 | Joshi et al. | 437/190 |
| 5,449,641 | 9/1995 | Maeda | 437/195 |
| 5,523,259 | 6/1996 | Merchant et al. | 437/190 |

OTHER PUBLICATIONS

Rossnagel, S., et al., "Collimated magnetron sputter deposition", J. Vac. Sci. Technol. A9(2), Mar./Apr. 1991, pp. 261–265.

Tohru Hara et al., "Properties of Titanium Layers Deposited by Collimation Sputtering", Oct. 17, 1992, Jpn. J. Appl. Phys. 31 (1992) Pt.2, No. 12B, pp. L1746–L1749.

S. Meikle et al., "Substrate temperature and collimator aspect ratio effects in titanium sputtering", Appl. Phys. Lett., vol. 63, No. 13, Sep. 27, 1993, pp. 1751–1752.

*Primary Examiner*—T. N. Quach
*Attorney, Agent, or Firm*—Jasper W. Dockrey

[57] ABSTRACT

A process for fabricating a semiconductor device which includes forming a collimated metal layer (54) on the surface of a semiconductor substrate (24), while maintaining the temperature of the substrate preferably below about 100° C., and most preferably below about 25° C. The collimated metal layer (54) is formed by directing a stream of metal atoms through a collimator (18) and onto the surface of the substrate (24). The temperature of the substrate (24) is controlled by supplying a heat transfer fluid from a temperature control system (26) to a vacuum chuck (14) supporting the semiconductor substrate (24). The collimated metal layer (54) is comprised of metal atoms having predominantly a (002) crystallographic orientation. The uniform crystallographic orientation of the collimated metal layer (54) can be used to effect the formation of additional metal layers (58, 62) having uniform crystallographic orientation.

6 Claims, 4 Drawing Sheets

5,580,823

1

PROCESS FOR FABRICATING A COLLIMATED METAL LAYER AND CONTACT STRUCTURE IN A SEMICONDUCTOR DEVICE

FIELD OF THE INVENTION

This invention relates, in general, to a method for fabricating a semiconductor device, and more particularly, to the formation of metal layers in the fabrication of metallized contact structures in a semiconductor device.

BACKGROUND OF THE INVENTION

The semiconductor industry is characterized by a trend toward fabricating larger and more complex functions on a given semiconductor chip. The larger and more complex functions are achieved by reducing device sizes and spacing, and by reducing the junction depth of regions formed in the semiconductor substrate. Among the feature sizes which are reduced in size are the width and spacing of interconnecting metal lines, and the contact openings through which the metal lines make electrical contact to active device regions in the substrate. As these feature sizes are reduced, new problems arise which must be solved in order to economically and reliably produce semiconductor devices.

As the junction depth of doped regions in the substrate below the contact opening decreases, steps must be taken to avoid junction spiking by metal layers deposited into the contact opening. To reduce junction spiking, a conductive material, such as titanium, is deposited into the contact then a layer of titanium nitride is formed to overlay the titanium layer. The titanium nitride acts as a diffusion barrier to prevent components of refractory metals and aluminum metal leads from entering the substrate and spiking the junction. The titanium layer functions to adhere the titanium layer to the contact structure, and to reduce native oxides on the substrate surface thereby lowering the electrical resistance in the contact. While the titanium/titanium nitride diffusion barrier has proven successful in preventing junction spiking, a high degree of step coverage must be obtained as the aspect ratio of contact openings increases.

The aspect ratio of a contact opening is defined as the depth of the opening divided by the width of the opening. As the aspect ratio of contact openings increases new device metallization processes are required to achieve adequate bottom surface coverage in a high aspect ratio contact. However, a titanium film with adequate bottom surface coverage cannot be obtained by conventional vapor deposition techniques. Accordingly, collimation sputtering has been developed to improve the conformality of deposited metal films.

Collimated metal layers can be deposited which meet the requirements of film deposition into high aspect ratio contact openings. Although collimation sputtering is an effective deposition method for improved bottom surface coverage in a metallized contact, it has been observed that metal films formed by collimation sputtering possess a high degree of surface roughness. Furthermore, as the collimator in the sputtering system ages, the crystallographic orientation of metal films slowly changes with the age of the collimator. Also, the surface roughness of the deposited films increases as the collimator ages.

An x-ray diffraction pattern taken from a titanium film formed by conventional collimation sputtering is shown in FIG. 1. The x-ray diffraction data indicates that a mixed crystallographic orientation is obtained by the conventional

2 deposition method. The mixture of crystalline orientations increases surface roughness of the titanium film and results in a poor quality titanium/titanium nitride interface in a contact structure. The poor quality interface and increased contact resistance can compromise the diffusion barrier characteristics of the titanium nitride film. Accordingly, new processing methods are necessary for the fabrication of collimated metal layers in high performance contact structures.

SUMMARY OF THE INVENTION

In practicing the present invention there is provided a process for the fabricating a collimated metal layer and contact structure in a semiconductor device. Precise crystallographic orientation in the collimated metal layer is obtained by directing sputtered metal atoms through a collimator and onto a surface, while maintaining the temperature of the surface below about 100 degrees C. Superior metal film properties are obtained through the practice of the present invention by controlling the crystallographic orientation of the deposited metal film. For example, a titanium film is deposited having substantially a (002) crystallographic orientation. The titanium film so deposited contains small grains providing a smooth surface topography, good bottom surface coverage in a high aspect ratio contact, and low electrical resistivity. Additionally, the uniform crystallographic orientation of the titanium film can be used as a nucleation site for the control deposition of a subsequent metal layer, in which the subsequently deposited metal layer also exhibits a uniform crystallographic orientation. A contact structure formed in accordance with the invention exhibits improved diffusion barrier and electromigration characteristics.

Figure 1:
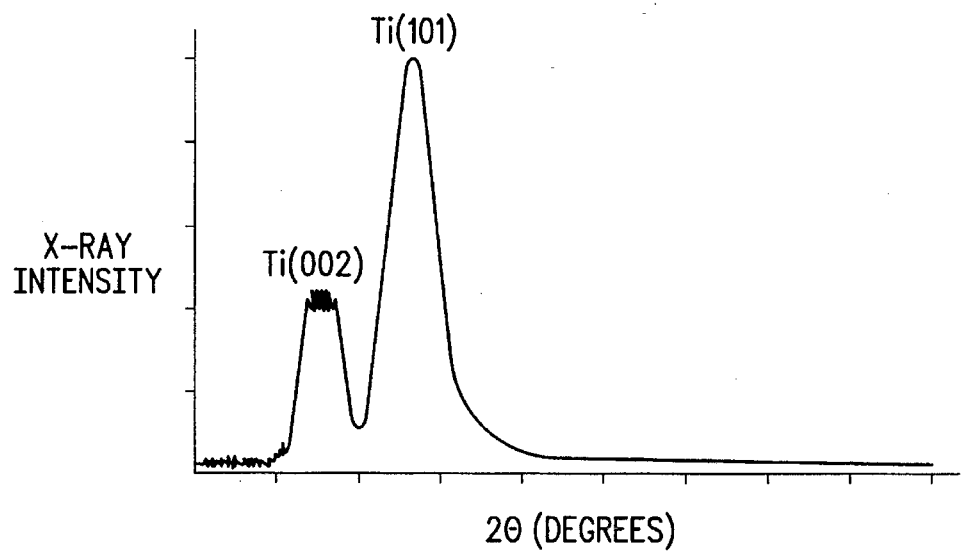
FIG. 1 is an x-ray diffraction pattern taken from a titanium film formed in accordance with the prior art.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention is for a metal deposition process in which a collimated metal layer is deposited on a substrate surface. The collimated metal deposition process is carried out while preferably maintaining the substrate surface at a temperature below about 100° C., and most preferably at a temperature of about 25° C. A collimated metal layer deposited at a low temperature exhibits a uniform crystallographic orientation. Metal films having a specified crystallographic orientation offer numerous advantages for use as thin-film layers in semiconductor devices. For example, by controlling the crystallographic orientation, a metal film can be deposited having a uniform grain size and a smooth surface topography. Furthermore, metal films deposited by the process of the present invention exhibit superior step coverage characteristics when deposited over surfaces having a high degree of topographical contrast. Metal films deposited in accordance with the invention enable the fabrication of high performance electrical contact structures in semiconductor devices. Moreover, in addition to exhibiting superior film characteristics, a metal film deposited in accordance with the invention can be used as a nucleation site for the formation of additional metal films. By controlling the crystallographic orientation of the nucleating metal film, metal films subsequently formed will also have a uniform crystallographic orientation. Metallized contact structures in a semiconductor device fabricated from metals of different composition, yet each having a uniform crystallographic orientation, provides a contact structure having superior electromigration resistance and diffusion barrier properties.

Figure 2:
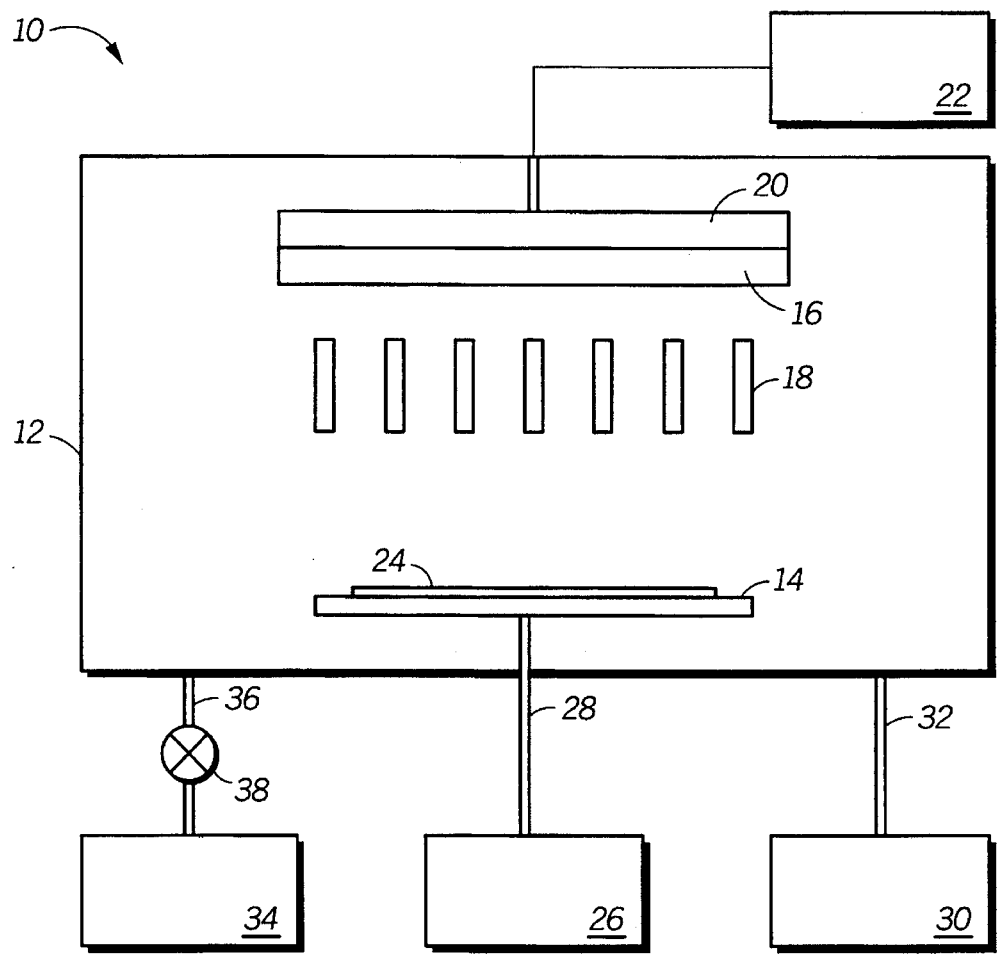
FIG. 2 is a schematic diagram of a sputtering system suitable for practicing the present invention.

Shown in FIG. 2 is a schematic diagram of a sputtering system 10 suitable for practicing the present invention. Sputtering system 10 includes a vacuum chamber 12 containing a vacuum chuck 14 opposite a sputtering target 16. A collimator 18 resides in the space between vacuum chuck 14 and sputtering target 16. Sputtering target 16 is attached to an electrode 20 powered by a DC power supply 22. A semiconductor substrate 24 resides on vacuum chuck 14. The backside of substrate 24 is cooled by gas circulating from temperature control system 26. Temperature control system 26 circulates a heat transfer fluid, such as argon gas or another inert gas, through conduit 28 and into channels (not shown) within vacuum chuck 14. The constant circulation of a heat transfer fluid, such as argon gas, through vacuum chuck 14 and contacting the backside of semiconductor substrate 24 functions to maintain semiconductor substrate 24 at a uniform, controlled temperature during a sputter deposition process.

A sputter deposition process is initiated in sputtering system 10 by activating vacuum control system 30 and evacuating vacuum chamber 12 through vacuum line 32. The vacuum pressure inside vacuum chamber 12 is controlled by bleeding sputtering gas, such as argon, into vacuum chamber 12 from gas control system 34 through gas line 36. The internal pressure in vacuum chamber 12 is adjusted to a desired level through operation of a mass flow controller 38 in gas line 36 and vacuum control system 30.

Once a desired pressure is achieved in vacuum chamber 12, a potential difference is created between vacuum chuck 14 and electrode 20 by applying DC power to electrode 20 from DC power supply 22. Metal sputtered from sputtering target 16 descends through collimator 18 and adheres to the surface of semiconductor substrate 24. Preferably, collimator 18 is a honeycomb collimator having an aspect ratio ranging from about 1.5/1.0 to 2.0/1.0. Collimator 18 is positioned in vacuum chamber 12 at a distance of about 20 to 50 mm from semiconductor substrate 24.

In a preferred embodiment of the invention, sputtering system 10 is employed to deposit a titanium metal film onto semiconductor substrate 24. A titanium film is deposited in sputtering system 10 at a chamber pressure of about 1.3 to 2.6 millitorr, using argon sputtering gas. Preferably, a collimator having an aspect ratio of 1.5/1.0 is positioned in vacuum chamber 12 at a distance of about 40 mm from semiconductor substrate 24. The sputtering of titanium metal from target 16 is initiated by applying about 8.0 kW of DC power to electrode 20. The sputtering process is carried out for an amount of time sufficient to form a titanium film having a thickness of about 400 angstroms on semiconductor substrate 24. During the deposition process, semiconductor substrate 24 is maintained at a temperature of about 50° C.

Figure 3:
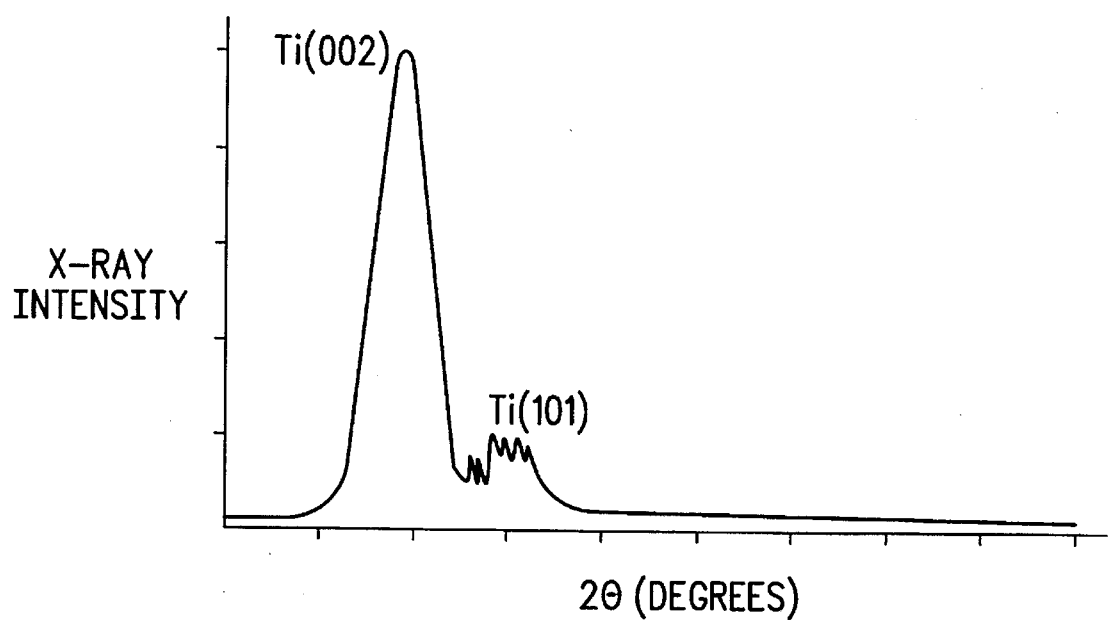
FIG. 3 is an x-ray diffraction pattern taken from a titanium film formed in accordance with the invention.

Shown in FIG. 3 is an x-ray diffraction pattern taken from a titanium film deposited in accordance with the invention. The x-ray diffraction data indicates a substantial amount of titanium having a (002) crystallographic orientation is present in the film. A smaller amount of titanium having a crystallographic orientation of (101) forms a component of the deposited film. The substantially large amount of (002) titanium obtained in a titanium film deposited in accordance with the invention can be readily seen by comparing the x-ray diffraction pattern in FIG. 3 with that of the prior art titanium film shown in FIG. 1. When comparing the x-ray diffraction data, the substantial increase in the (002) crystallographic orientation is readily apparent. Further, the titanium film deposited in accordance with the invention contains many small precisely defined grains forming a smooth metal surface and exhibits an electrical resistivity of about 63 μohm-cm.

In processes of the prior art, as the collimator ages with use, the amount of (101) titanium increases resulting in a bi-modal grain size distribution in the deposited titanium film. However, the deposition process of the present invention is not sensitive to the age of the collimator. Accordingly, the present invention provides a metal film having a uniform grain size and crystalline orientation regardless of the extent of previous use of the collimator. The ability to consistently deposit a metal film having a specified structure improves the manufacturing reliability and the quality of contact structures in a semiconductor device.

In another embodiment of the invention, a two-step process is carried out to form a metal layer having a precisely determined crystallographic orientation. In the two-step process, a collimated metal layer is deposited onto the substrate surface while maintaining the substrate temperature at a temperature less than about 100° C. Then, a second metal layer is formed on the collimated metal layer, while maintaining the substrate temperature at a second temperature. Preferably, the second metal layer is deposited while maintaining the substrate temperature at a temperature above about 200° C. By forming a first collimated metal layer using the low temperature deposition process of the invention, a metal film having a precisely controlled crystallographic orientation is obtained. Because the second metal layer uses the first collimated metal layer as a nucleation site, the second metal layer will also have a uniform crystallographic orientation. For example, where the first and second metal layers are titanium, the second metal layer will have an identical crystallographic orientation to that of the first titanium metal layer.

Figure 4:
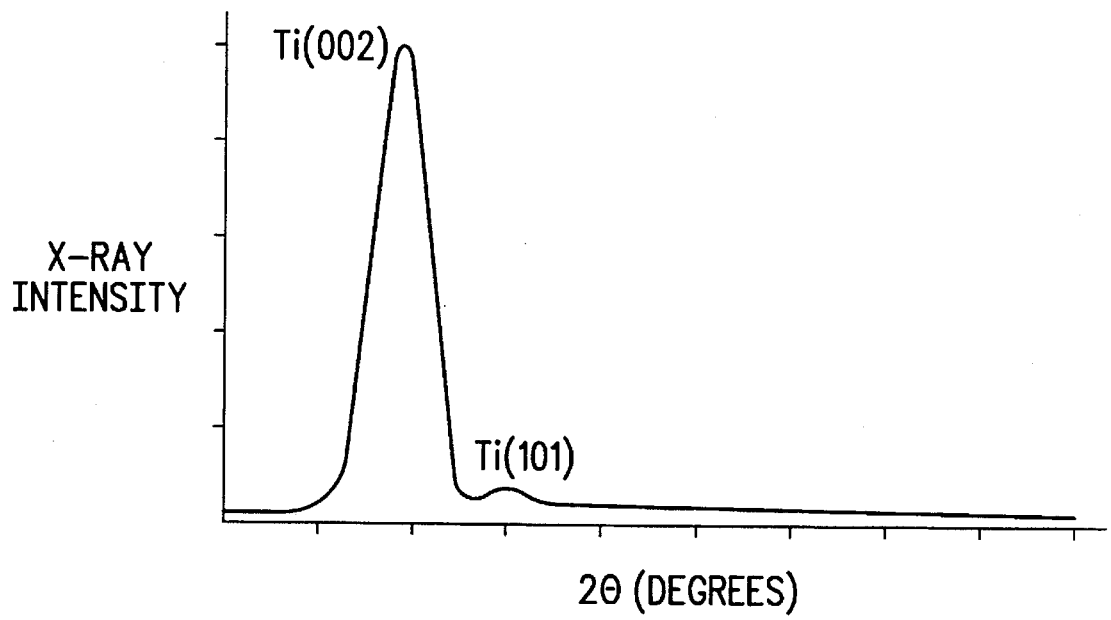
FIG. 4 is an x-ray diffraction pattern taken from a titanium film formed in accordance with an alternative embodiment of the invention.

An x-ray diffraction pattern taken from a metal layer deposited in accordance with the two-step process of the invention is shown in FIG. 4. The x-ray diffraction data indicates that a predominant (002) crystallographic orientation is created by the two-step process. A comparison of the x-ray diffraction data shown in FIGS. 3 and 4 indicates that a titanium film deposited by the two-step process contains an even greater amount of (002) titanium than a titanium film formed in accordance with the single step process shown in FIG. 3. The high deposition temperature of the second deposition step enables the formation of a high density titanium film. Thus, the two-step deposition process is advantages for the formation of films having a high degree of diffusion resistance.

Figure 5:
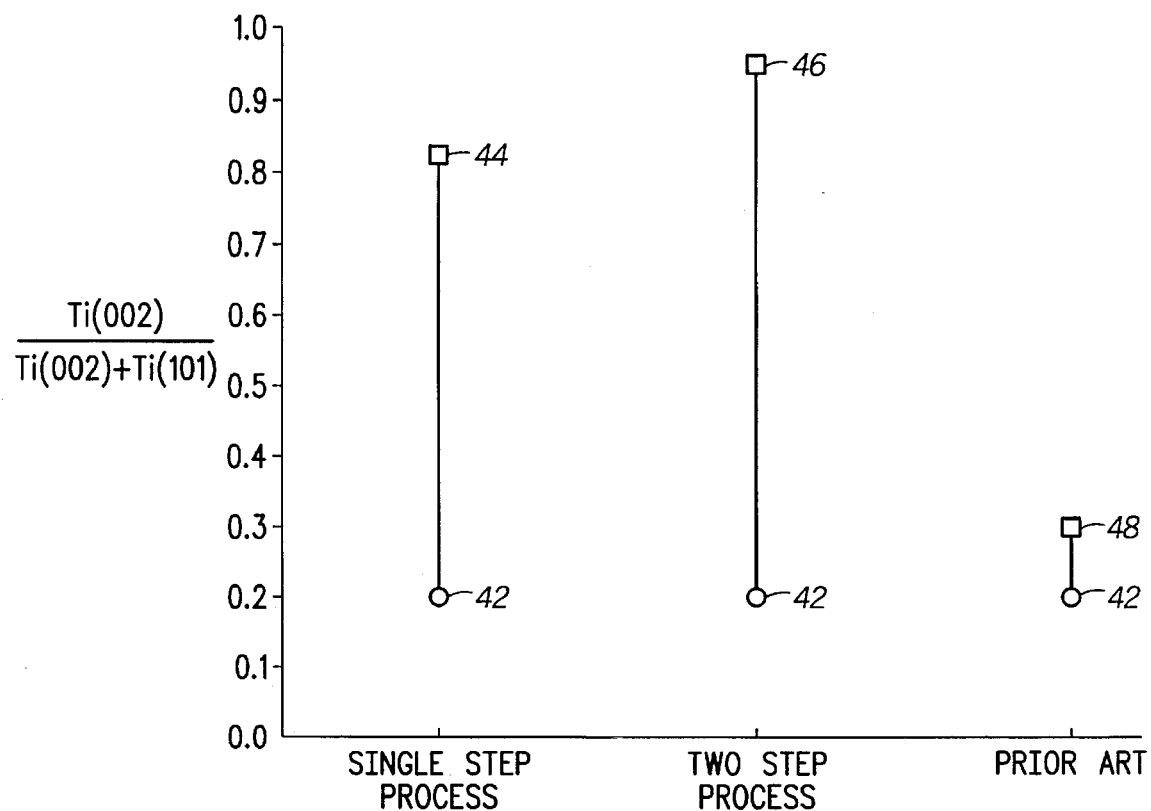
FIG. 5 is a graphical representation of the quantitative differences in the proportional amount of (002) titanium deposited in accordance with the invention, and with the prior art.

A quantitative comparison of the (002) crystallographic component of titanium film deposited in accordance with the single step process, the two-step process, and the prior art, is illustrated in the graph of FIG. 5. The vertical scale is a compositional index representing the proportional amount of (002) titanium in a titanium film containing both (002) and (101) titanium crystal. A quantitative determination is made by comparing the proportional amount of (002) titanium in the deposited films with that of a reference standard designated by points 42 in FIG. 5. The reference standard has a compositional index of about 0.21. The composition of titanium films deposited by the single-step process and by the two-step process are shown by points 44 and 46, respectively.

The vertical lines connecting reference points 42 with data points 44 and 46 graphically illustrates the difference in the quantity of (002) titanium crystal in titanium films deposited in accordance with the single-step process and the two-step process. The substantially greater quantity of (002) titanium in films deposited in accordance with the invention can be readily seen in FIG. 5 by comparing data points 44 and 46 with data point 48. Data point 48 represents the quantity of (002) titanium crystal measured by x-ray diffraction in a titanium film deposit in accordance with the prior art.

Figure 6:
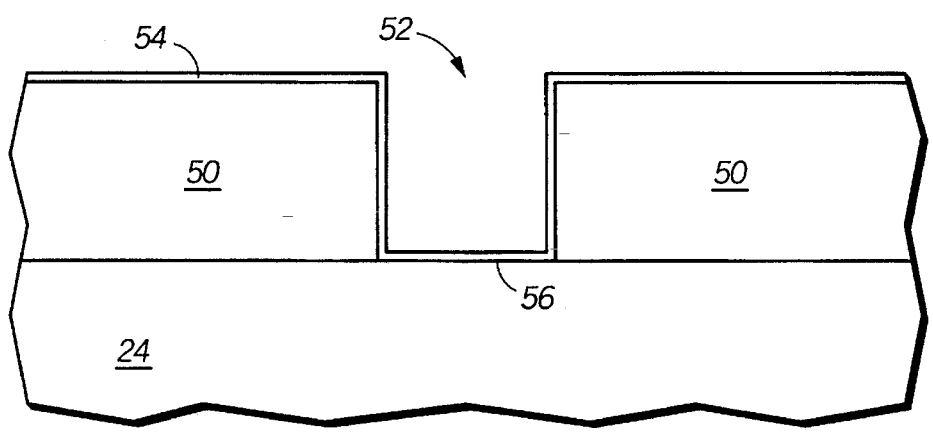
FIGS. 6–8 illustrate, in cross-section, process steps for the fabrication of a metallized contact structure in accordance with the invention.
Figure 7:
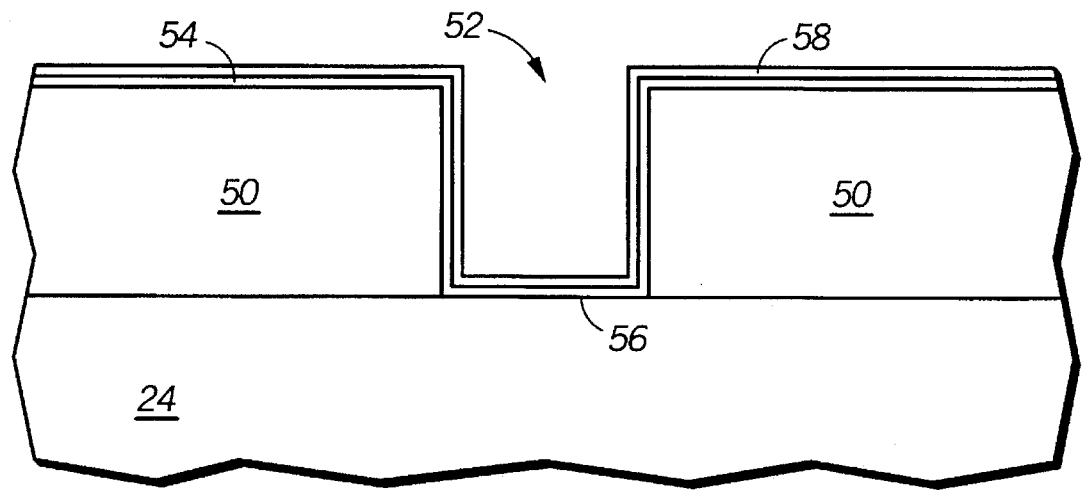
Figure 8:
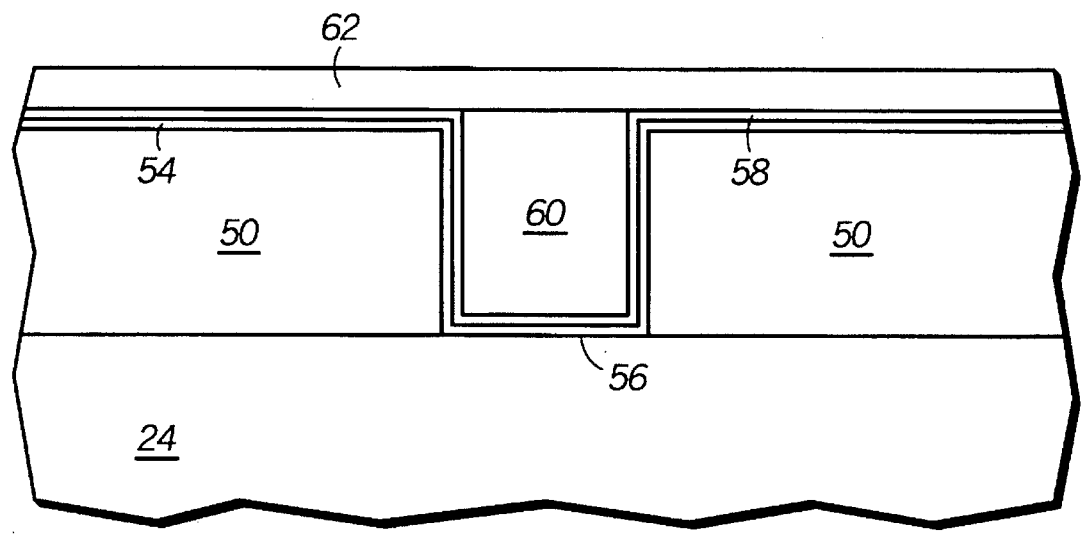

A process for fabricating a metallized contact structure using the process of the present invention is illustrated in FIGS. 6–8. Although a specific metallized contact structure is illustrated in the figures, those skilled in the art will recognize that many different types of metal structures can be fabricated by means of the deposition process of the present invention. Accordingly, the process shown in FIGS. 6–8 is exemplary of those fabrication processes within the scope of the present invention.

Shown in FIG. 6, in cross-section, is a portion of semiconductor substrate 24 having an insulation layer 50 thereon. Insulation layer 50 includes an opening 52 which exposes a surface portion of substrate 24. A collimated titanium layer 54 overlies the surface of insulation layer 50 and a surface portion 56 of semiconductor substrate 24. Collimated titanium layer 54 is preferably deposited using sputtering system 10 while maintaining the temperature of semiconductor substrate 24 at about 25° C. Under the processing conditions of the present invention, collimated titanium layer 54 is predominantly (002) titanium.

After depositing collimated titanium layer 54, a titanium nitride layer 58 is deposited to overlie collimated titanium layer 54, as shown in FIG. 7. Titanium nitride layer 58 uses collimated titanium layer 54 as a nucleation site during the deposition process, and is deposited having predominantly a (111) crystallographic orientation. Because collimated titanium layer 54 has been previously deposited to have a defined (002) crystallographic orientation, no special temperature control or processing methods are necessary to generate (111) titanium nitride. Preferably, titanium nitride layer 58 is deposited at a temperature of about 300° to 450° C.

In the metallized contact structure formed in accordance with the invention, the titanium nitride layer functions as a diffusion barrier to prevent contamination and chemical constituents of subsequently deposited metal layers from entering substrate 24 through surface portion 56. Improved diffusion barrier characteristics are obtained by forming titanium nitride having a uniform crystallographic orientation. Additionally, titanium nitride layer 58 exhibits good step coverage through opening 52.

The metallized contact structure is completed by forming a refractory metal plug 60 in opening 52 and an overlying aluminum layer 62, as illustrated in FIG. 8. During the aluminum deposition process, titanium nitride layer 58 acts as a nucleation site for the deposition of aluminum layers 62. The (111) crystallographic orientation of titanium nitride layer 58 is propagated through aluminum layer 62 during the aluminum deposition process. Accordingly, aluminum layer 62 is predominantly (111) aluminum.

The formation of electromigration resistant aluminum improves the long term reliability of the electrical contact structure illustrated in FIG. 8. High performance metal leads interconnecting metallized contact structures must be metallurgical stable during device operation. Metallurgical stability is achieved by the formation of aluminum leads having a high degree of resistance to electromigration phenomenon. In severe cases, electromigration occurring during device operation, can result in the formation of voids in the metal leads interconnecting various components of the device. The voids create open circuits leading to failure of the semiconductor device. Through the fabrication process of the present invention, aluminum leads having a uniform crystallographic orientation and superior electrode migration resistance are provided. Additionally, the improved step coverage of the titanium and titanium nitride layers, reduces the probability of void formation in the aluminum leads by providing a uniformly thick barrier layer in the contact regions.

Thus it is apparent that there has been provided, in accordance with the invention, a process for fabricating a collimated metal layer and contact structure in a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other types of contact structures, such as those having inlaid metal leads, via structures interconnecting two layers of metal interconnects, and the like, can also be fabricated using the present invention. It is therefore intended to include within the invention all such variations and modifications as fall within the scope of the appended claims and equivalents thereof.

We claim:

1. A process for fabricating a collimated metal layer in a semiconductor device comprising the steps of:

providing a surface;

forming a first titanium layer on the surface, while maintaining the temperature of the surface at a first temperature; and forming a second titanium layer on the first titanium layer, while maintaining the temperature of the surface at a second temperature, wherein the second temperature is greater than the first temperature, wherein the step of forming the first titanium layer and the step of forming the second titanium layer comprise sequential sputter deposition of titanium through a collimator, and wherein the first and second titanium layers form a titanium film having a (002) predominant crystalline orientation.

2. The process of claim 1, wherein the first temperature is less than about 100° C., and the second temperature is greater than about 200° C.

3. A process for fabricating a collimated metal layer and contact structure semiconductor device comprising the steps of:

providing a deposition apparatus having a collimator therein;

placing a substrate in the deposition apparatus;

controlling the temperature of the substrate at a temperature less than about 100° C.;

generating a particle stream through the collimator;

forming a first titanium layer on the substrate having a (002) predominant crystalline orientation; and forming a second titanium layer on the first titanium layer while controlling the temperature of the substrate at a temperature greater than about 200° C., wherein the first and second titanium layers form a titanium film having a (002) predominant crystalline orientation.

4. The process of claim 3 further comprising the step of forming a titanium nitride layer on second titanium layer while controlling the temperature of the substrate at a temperature greater than about 200° C.

5. The process of claim 4 further comprising the step of forming an aluminum layer on the titanium nitride layer while controlling the temperature of the substrate at a temperature greater than about 200° C.

6. The process of claim 5, wherein the titanium nitride layer and the aluminum layer have a (111) crystallographic orientation.

* * * * *